United States Patent
Jin et al.

(10) Patent No.: US 7,754,516 B2
(45) Date of Patent: Jul. 13, 2010

(54) FABRICATING SUB-LITHOGRAPHIC CONTACTS

(76) Inventors: Ming Jin, 1470 Sierraville Ave., San Jose, CA (US) 94132; Ilya V. Karpov, 4386 Lakeshore Dr., Santa Clara, CA (US) 95054; Jinwook Lee, 1392 Johnson Ave., San Jose, CA (US) 95129; Narahari Ramanuja, 2000 Walnut Ave., Apt. D206, Fremont, CA (US) 94538

( * ) Notice: Subject to any disclaimer, the term of this patent is extended or adjusted under 35 U.S.C. 154(b) by 0 days.

(21) Appl. No.: 12/287,073

(22) Filed: Oct. 6, 2008

(65) Prior Publication Data

US 2009/0142927 A1 Jun. 4, 2009

Related U.S. Application Data

(62) Division of application No. 11/193,952, filed on Jul. 29, 2005, now abandoned.

(51) Int. Cl.
*H01L 45/00* (2006.01)

(52) U.S. Cl. .............. 438/54; 257/E45.002; 438/95
(58) Field of Classification Search .............. 438/54, 438/95; 257/E45.002, E45.003
See application file for complete search history.

(56) References Cited

U.S. PATENT DOCUMENTS

| | | | |
|---|---|---|---|
| 2005/0127349 A1* | 6/2005 | Horak et al. | 257/3 |
| 2005/0263823 A1* | 12/2005 | Hwang et al. | 257/368 |
| 2006/0175597 A1* | 8/2006 | Happ | 257/2 |

* cited by examiner

*Primary Examiner*—Jerome Jackson, Jr.
*Assistant Examiner*—Paul A Budd
(74) *Attorney, Agent, or Firm*—Trop, Pruner & Hu, P.C.

(57) ABSTRACT

A small critical dimension element, such as a heater for an ovonic unified memory, may be formed within a pore by using successive sidewall spacers. The use of at least two successive spacers enables the limitations imposed by lithography and the limitations imposed by bread loafing to be overcome to provide reduced critical dimension elements.

2 Claims, 3 Drawing Sheets

FABRICATING SUB-LITHOGRAPHIC CONTACTS

CROSS-REFERENCE TO RELATED APPLICATIONS

This application is a divisional of U.S. patent application Ser. No. 11/193,952, filed Jul. 29, 2005 now abandoned.

BACKGROUND

This invention relates generally to semiconductor technologies and to semiconductor manufacturing processes.

In a number of applications, it is desirable to manufacture relatively small contacts. These contacts may be formed within vias or within pores.

For example, in connection with phase change memories, it may be desirable to form a pore into which a contact is formed. Over the contact may be defined a heater which resides within the pore. The heater is then covered by a phase change material so that the heater is capable, when passing electrical current, to heat the chalcogenide and to cause it to change phase. These different phases may be associated with different measurable resistivities. As a result, a phase change memory may be formed. Since it is desirable to reduce the programming current, it may also be desirable to reduce the size of the heater.

In a number of instances, making relatively small critical dimension parts is limited by the dimensions achievable with lithographic techniques. Today, lithographic techniques limit feature size to about 180 nanometers.

Thus, it would be desirable to form features that are smaller than 180 nanometers.

DETAILED DESCRIPTION

In order to overcome the limits of lithographic processes, a spacer technology may be utilized. In a spacer technology, a pore may be formed within an insulator and sidewall spacers formed on the sidewalls of that pore. As a result, the sidewall spacers enable the pore size to be reduced to a sub-lithographic dimension. However, there is a limit to how small the pore may be formed in some cases because of what is called bread loafing. Bread loafing occurs when the opposed upper edges of the deposited sidewall spacer forming material becomes enlarged, extends into the pore and eventually closes off the pore and cuts off access to the interior of the pore.

In order to make a critical dimension smaller than that possible with lithographic technologies and smaller than that permitted by the bread loafing limitation, a two-phase process may be utilized wherein, in a first phase a first sidewall spacer is formed, any bread loafing is reduced or cleared and then a second sidewall spacer is formed over the first sidewall spacer, followed by bread loaf reduction. As a result of the repeated processes, relatively smaller critical dimensions may be formed. For example, in some embodiments, critical dimensions of at least as small as 60 nanometers can be formed. The critical dimension limitation with lithographic technology may be about 180 nanometers and with a single spacer technology the limitation may be around 80 nanometers in some embodiments.

Figure 1:
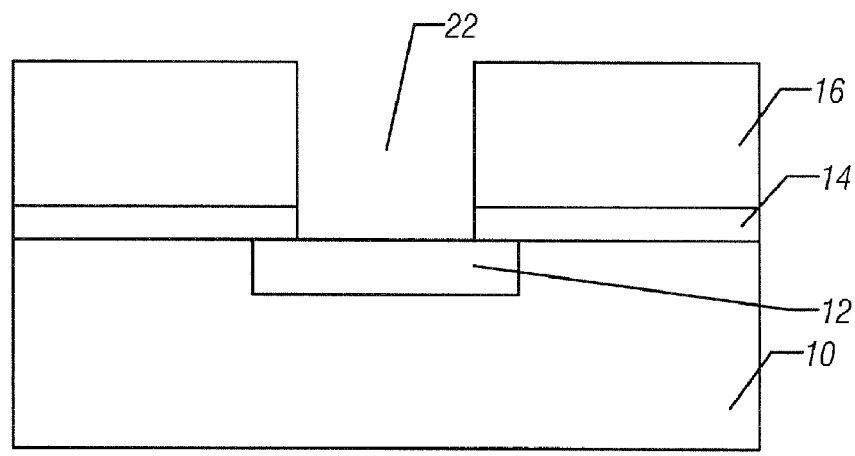
FIG. 1 is an enlarged, cross-sectional view at an early stage of manufacture of one embodiment of the present invention.

Referring to FIG. 1, an embodiment is illustrated that is used to form a semiconductor phase change or ovonic unified memory (OUM). However, the present application has applicability to a wide range of semiconductor technologies in which contacts or other features are formed at sub-lithographic dimensions.

In FIG. 1, an interlayer dielectric 10 may be positioned over a substrate (not shown). The interlayer dielectric 10 may be formed of any dielectric insulating material, including oxide. Defined within the interlayer dielectric 10 is an electrical address line 12 which may be considered a row line in some embodiments of the present invention. The formation of copper row lines is well known to those skilled in the art.

Over the dielectric 10 may be formed another insulating layer 14 which, in one embodiment, may be nitride, and another insulating layer 16, which may be thicker than the layer 14. The layer 16 may be formed of oxide for example. A pore 22 may be defined using conventional lithographic techniques. The pore 22 may have a critical dimension, limited by lithographic capabilities, such that the width of the pore 22 is limited to be about 180 nanometers or larger in some embodiments.

Figure 2:
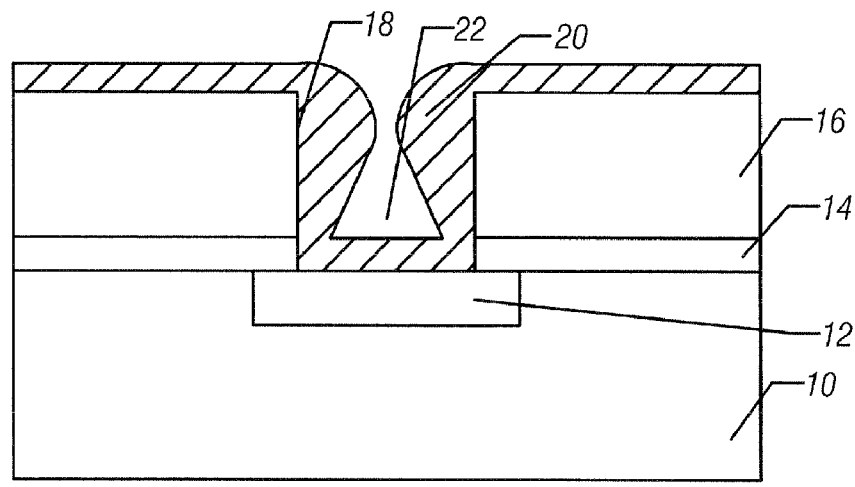
FIG. 2 is an enlarged, cross-sectional view of the embodiment of FIG. 1 at subsequent stage of manufacture.

A sidewall spacer may be formed in the pore 22 as shown in FIG. 2. The sidewall spacer may be formed of nitride spacer material 18. The nitride spacer material 18 may be deposited using conventional techniques and bread loafing may begin to occur as indicated at 20. Again, the bread loafing is the extension of the upper edges of the coating into the pore 22. Eventually, the bread loafed portions 20 could touch, if a thicker sidewall spacer was attempted, cutting off access to the pore 22. Once contact occurs between the two opposed, bread loafed portions 20, it is no longer possible to etch out the sidewall spacer.

Figure 3:
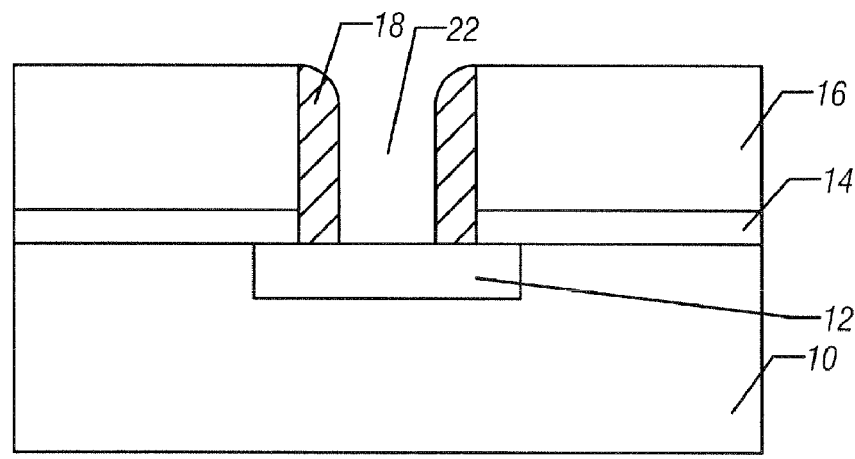
FIG. 3 is an enlarged, cross-sectional view of the embodiment shown in FIG. 2 at a subsequent stage of manufacture in accordance with one embodiment of the present invention.

The spacer material 18 may then be exposed to an anisotropic plasma etch. The etch parameters may be optimized to remove the bread loafed portions 20. As a result, in the sidewall spacers 18 shown in FIG. 3, the size of the critical dimension of the pore 22 may be reduced, for example, to about 80 nanometers. In addition, the bread loafed portion 20 may be substantially removed. While an embodiment using a nitride spacer is disclosed, other sidewall spacers may be utilized as well.

Figure 4:
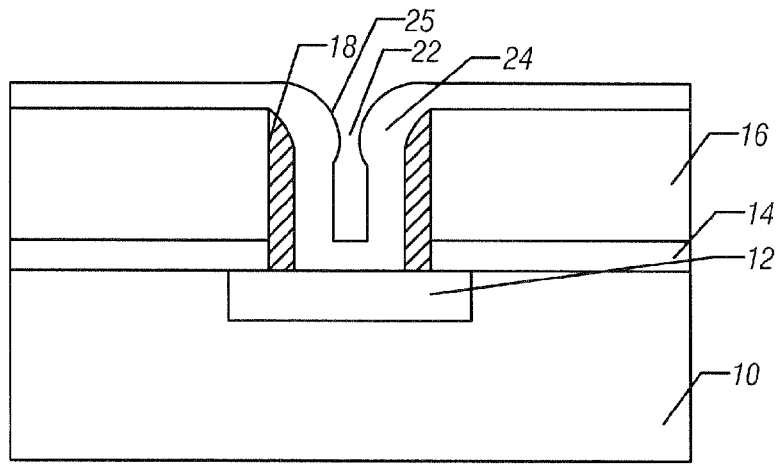
FIG. 4 is an enlarged, cross-sectional view of the embodiment shown in FIG. 3 after further processing in accordance with one embodiment of the present invention.

Then, referring to FIG. 4, a second sidewall spacer material 24 may be deposited over the first formed sidewall spacer 18. The material 24 may again be nitride. The sidewall spacer 24 may exhibit some bread loafing, but, again, the process may be stopped before the bread loafing closes off the pore 22.

Figure 5:
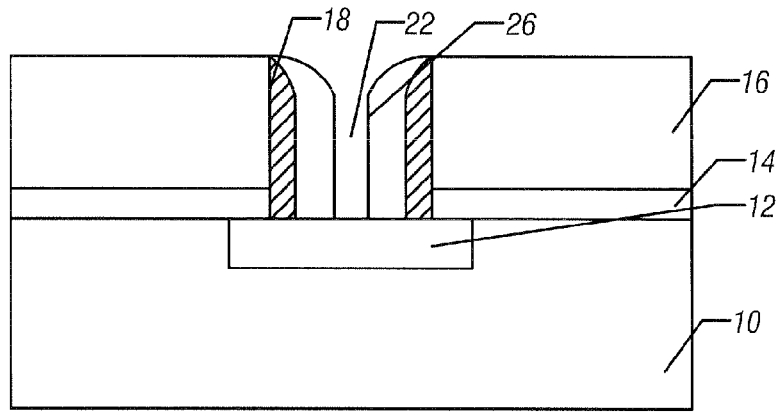
FIG. 5 is an enlarged, cross-sectional view of the embodiment of FIG. 4 after additional processing in accordance with one embodiment of the present invention.
Figure 6:
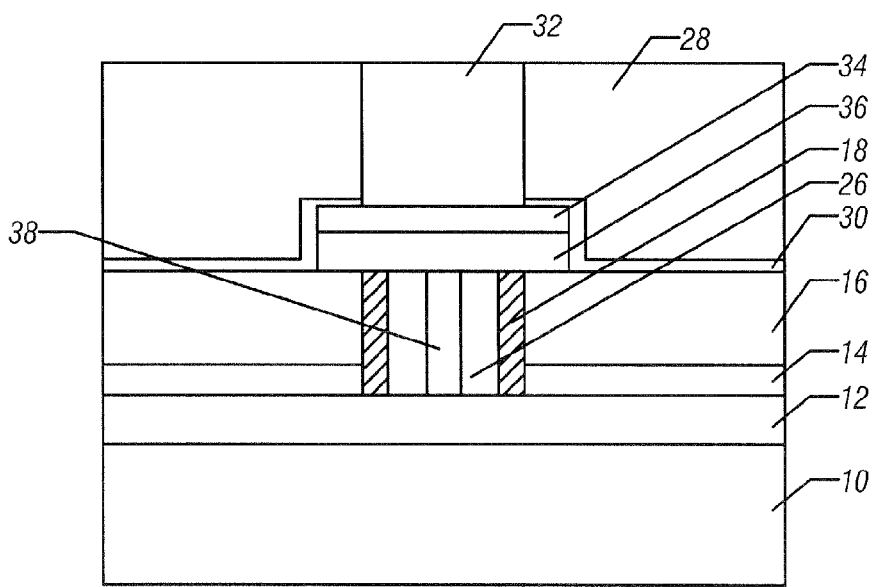
FIG. 6 is an enlarged, cross-sectional view of the finished device in accordance with one embodiment of the present invention.

Then, as indicated in FIG. 5, the sidewall spacer 24 may, again, be defined by a plasma based anisotropic etch. The etch may have its power and etch time optimized to reduce the bread loafed shoulder 25 and to open the pore 22 to the bottom contact which, in this case, is the electrical line 12. In some embodiments, the critical dimension of the pore 22 may be reduced to 60 nanometers or less.

Then, in an embodiment in which an ovonic unified memory is formed, the pore 22 may be filled with a layer of heater material 38. The heater material 38 may, in one embodiment, be formed of titanium silicon nitride, which may be deposited by chemical vapor deposition. The resulting product is then planarized.

Over the planarized surface may be formed a layer 36 of a chalcogenide material, in turn covered by a layer 34 that forms a top electrode. The chalcogenide material may be 225 GST ($Ge_2Sb_2Te_5$) in one embodiment. The layers 34 and 36 may be patterned and etched into stripes or dots in some embodiments.

Then, the top electrode 34 may be covered by an encapsulation layer 30 in some embodiments. The encapsulation layer 30 protects the sidewalls of the chalcogenide material 36 and provides passivation. In one embodiment, the encapsulation layer 30 may be formed of low temperature nitride.

Next, a top passivating layer 28 may be applied which, in some embodiments, may be an oxide interlayer dielectric. Another address line 32 may be formed in the dielectric 28. The address line 32 may extend transversely to the address line 12. Thus, in some embodiments, the address line 32 may be considered a column line.

Thus, in some embodiments, relatively small critical dimension features may be formed which have dimensions smaller than lithographic dimensions and which are smaller than the limitations imposed by bread loafing in sidewall spacer technology. In some embodiments, more than two successive sidewall spacers may be formed. Successive sidewall spacers may be formed of the same or different materials.

The chalcogenide layer 36 may be a phase change, programmable material capable of being programmed into one of at least two memory states by applying a current to alter the phase of memory material between a more crystalline state and a more amorphous state, wherein the resistance of memory material in the substantially amorphous state is greater than the resistance of memory material in the substantially crystalline state.

Programming of the layer 36 to alter the state or phase of the material may be accomplished by applying voltage potentials to electrodes or lines 12 and 32, thereby generating a voltage potential across the layer 36. An electrical current may flow through the layer 36 in response to the applied voltage potentials, and may result in heating of the layer 36.

This heating may alter the state or phase of chalcogenide. Altering the phase or state of layer 18, may alter the electrical characteristic of memory material, e.g., the resistance of the material may be altered by altering the phase of the memory material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of "reset" and "set" with amorphous and crystalline states, respectively, is a convention and that at least an opposite convention may be adopted.

Using electrical current, the memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 7:
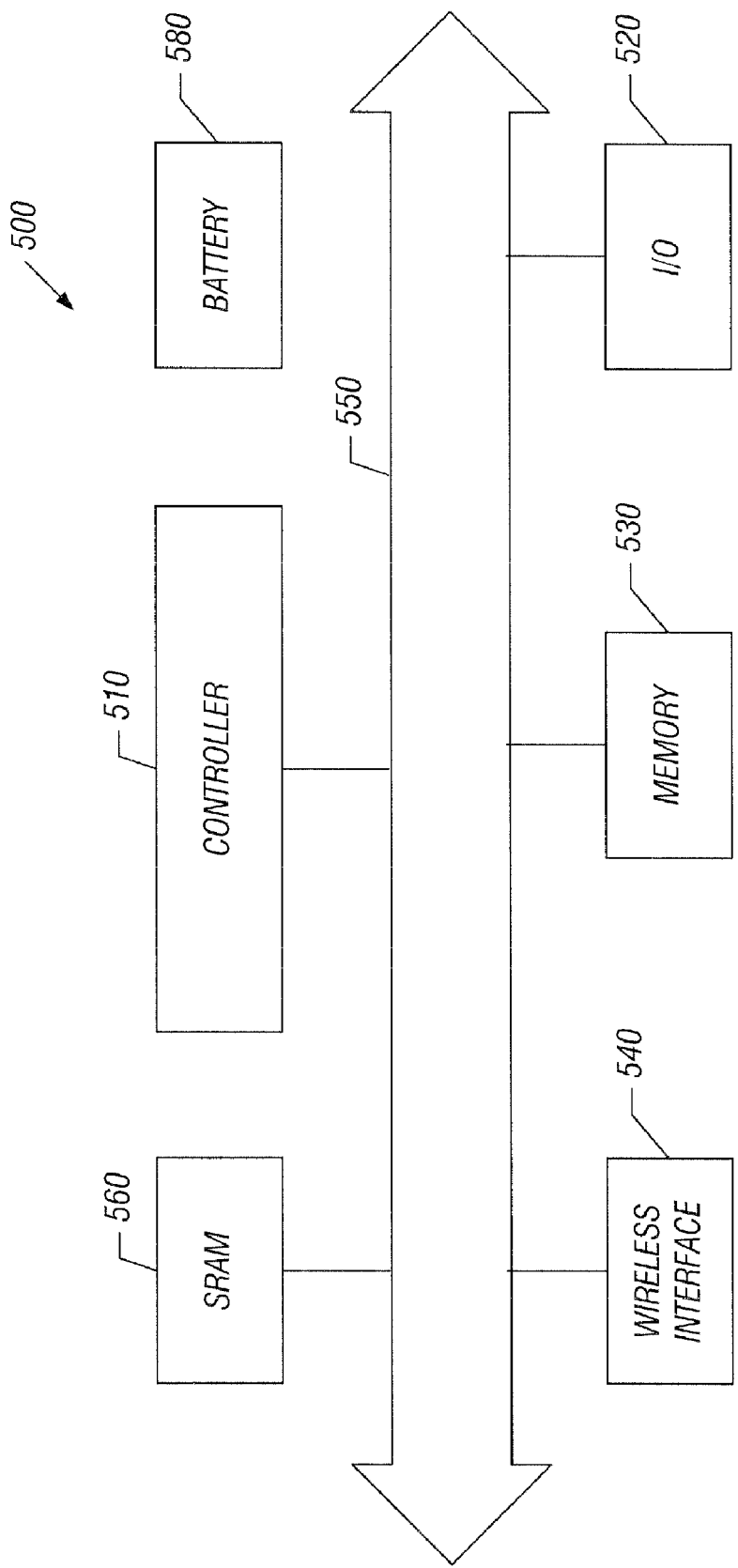
FIG. 7 is a system depiction of one embodiment of the present invention.

Turning to FIG. 7, a portion of a system 500, in accordance with an embodiment of the present invention, is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. The system 500 may be powered by a battery 580 in one embodiment. It should be noted that the scope of the present invention is not limited to embodiments having any or all of these components or to battery-powered or wireless embodiments.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect. A static random access memory (SRAM) 560 may also be coupled to bus 550.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a first sidewall spacer within a pore by depositing and anisotropically etching a first spacer material;

forming a bread loaf portion in said first spacer material and reducing the extent of said bread loaf portion by etching;

forming a second sidewall spacer within said pore over the first sidewall spacer;

forming a heater within said pore; and forming a chalcogenide layer over said heater.

2. The method of claim 1 including depositing a second spacer material to form said second sidewall spacer, said second spacer material including a bread loaf portion and etching to reduce the extent of said bread loaf portion.

* * * * *